United States Patent
Kobayashi

[11] Patent Number: 6,054,757
[45] Date of Patent: Apr. 25, 2000

[54] SEMICONDUCTOR APPARATUS, CIRCUIT BOARD AND COMBINATION THEREOF

[75] Inventor: Harufumi Kobayashi, Tokyo, Japan

[73] Assignee: Oki Electric Industry Co., Ltd., Tokyo, Japan

[21] Appl. No.: 09/030,924

[22] Filed: Feb. 26, 1998

[30] Foreign Application Priority Data

Feb. 27, 1997 [JP] Japan .................................. 9-042775

[51] Int. Cl.⁷ .................................................. H01L 23/48
[52] U.S. Cl. ........................ 257/690; 257/690; 257/692; 257/778
[58] Field of Search .................................. 257/787, 778, 257/690, 730, 692, 737, 738

[56] References Cited

U.S. PATENT DOCUMENTS

| | | |
|---|---|---|
| 4,530,002 | 7/1985 | Kanai . |
| 5,157,480 | 10/1992 | McShane et al. . |
| 5,306,948 | 4/1994 | Yamada et al. . |
| 5,450,289 | 9/1995 | Kweon et al. . |
| 5,563,446 | 10/1996 | Chia et al. ............................. 257/787 |
| 5,789,811 | 8/1998 | Chia et al. ............................. 257/787 |

FOREIGN PATENT DOCUMENTS

| | | |
|---|---|---|
| 0 113 292 | 7/1984 | European Pat. Off. . |
| 0 361 495 | 4/1990 | European Pat. Off. . |
| 59-63751 | 4/1984 | Japan . |
| 07-57832 | 3/1995 | Japan . |

OTHER PUBLICATIONS

*A Mixed Solder Grid Array and Peripheral Leaded MCM Package*, Hashemi et al., Institute of Electrical and Electronics Engineers, Proceedings of the Electronic Components and Technology Conference, Orlando, Jun. 1–4, 1993, pp. 951–956.

*Primary Examiner*—Carl Whitehead, Jr.
*Assistant Examiner*—Roy Potter
*Attorney, Agent, or Firm*—Rabin & Champagne, PC

[57] ABSTRACT

A semiconductor apparatus includes a semiconductor chip contained in a package; a first set of connection terminals, of which one ends are connected to the semiconductor chip and the other ends are connected onto a first connection plane outside of the package; and a second set of connection terminals, of which one ends are connected to the semiconductor chip and the other ends are connected onto a second connection plane outside of the package. The first and second connection planes are electrically connected to a circuit board.

17 Claims, 6 Drawing Sheets

SEMICONDUCTOR APPARATUS, CIRCUIT BOARD AND COMBINATION THEREOF

CROSS REFERENCE TO RELATED APPLICATION

This application claims the priority of Application No. H09-042775, filed Feb. 27, 1997 in Japan, the subject matter of which is incorporated herein by reference.

TECHNICAL FIELD OF THE INVENTION

The present invention relates to a semiconductor apparatus, and more particularly to a package design and mounting technique of a semiconductor apparatus.

BACKGROUND OF THE INVENTION

In most cases, semiconductor chips are incorporated into an individual protective package, connected onto a printed circuit board. In a conventional semiconductor apparatus, external terminals (connection terminals) extending from the protective package are bonded onto a flat plane of the printed circuit board. For example, in a flat package, leads (connection terminals) are bonded around the package onto the surface of the printed circuit board. The pitch (spacing) between two adjacent leads is designed to be small, such as 1.27 mm, so as to contribute to increasing the number of leads (terminals). Such a package is designed small in size and is shaped almost square, so that connecting lines (inner leads) in the package can be designed to have the same length; and therefore, it is easy to control impedance thereof Such package design is useful for a high performance semiconductor apparatus.

According to the conventional semiconductor apparatus, the connection terminals are connected onto the single plane of the printed circuit board, so that it is required to narrow the pitch between two adjacent terminals in order to increase the number of terminals. The pitch of the connection terminals is basically defined by the mounting technique, for example, 0.3 mm of pitch would be the minimum for QFP in reflow solder-bonding technique. Accordingly, in order to increase the number of the connection terminals, the only way is to make a pitch of terminals narrower than 0.3 mm. According to the current mounting technology, however, it is difficult to mount the semiconductor apparatus, having the connection terminals with a pitch of less than 0.3 mm, onto the printed circuit board.

OBJECTS OF THE INVENTION

Accordingly, an object of the invention is to provide a semiconductor apparatus which can be easily mounted onto a circuit board even though connection terminals are increased in number.

Another object of the invention is to provide a circuit board that contributes to increasing the number of connection terminals of a semiconductor apparatus.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, a semiconductor apparatus includes a semiconductor chip contained in a package; a first set of connection terminals, of which one ends are connected to the semiconductor chip and the other ends are connected onto a first connection plane outside of the package; and a second set of connection terminals, of which one ends are connected to the semiconductor chip and the other ends are connected onto a second connection plane outside of the package. The first and second connection planes are electrically connected to a circuit board.

In the semiconductor apparatus, the first and second sets of connection terminals may be arranged alternately with a predetermined pitch in the package.

According to a second aspect of the invention, a circuit board onto which a semiconductor apparatus is mounted, includes a first connection plane onto which one ends of a first set of connection terminals, extending from the semiconductor apparatus, are connected; and a second connection plane onto which one ends of a second set of connection terminals, extending from the semiconductor apparatus, are connected.

In the circuit board, the first and second connection planes may be arranged perpendicularly to each other. In this case, the first set of connection terminals extend to the first connection plane, while the second set of connection terminals extend to the second connection plane. In another case, the first and second connection planes may be arranged parallel to each other in the different levels. In this case, the first set of connection terminals extend to the first connection plane, and the second set of connection terminals extend parallel to the second connection plane.

A third aspect of the invention is provided on a combination of the above described semiconductor apparatus and circuit board.

According to the invention, the first and second sets of connection terminals are connected to the different planes, so that the number of connection terminals can be easily increased without narrowing the pitch of the terminals on the circuit board. In other words, even if the connection terminals are tightly arranged in the package, the connection terminals can be arranged with enough spacing outside the package.

DETAILED DESCRIPTION OF THE INVENTION

Figure 1:
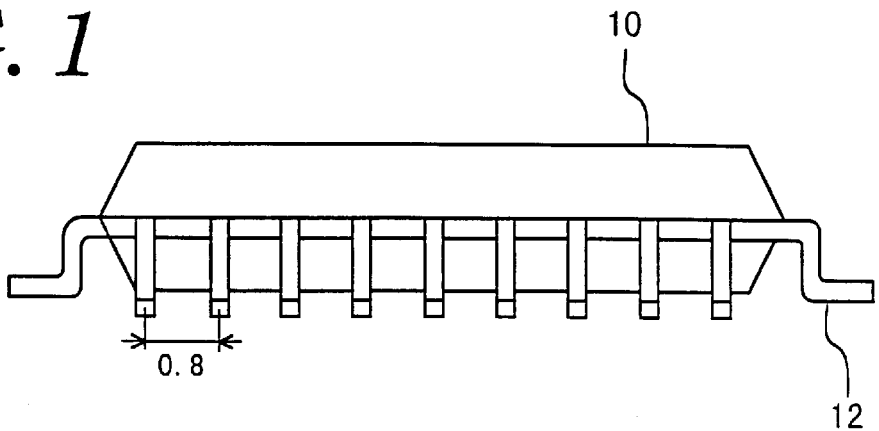
FIG. 1 is a side view illustrating a conventional semiconductor apparatus.
Figure 2:
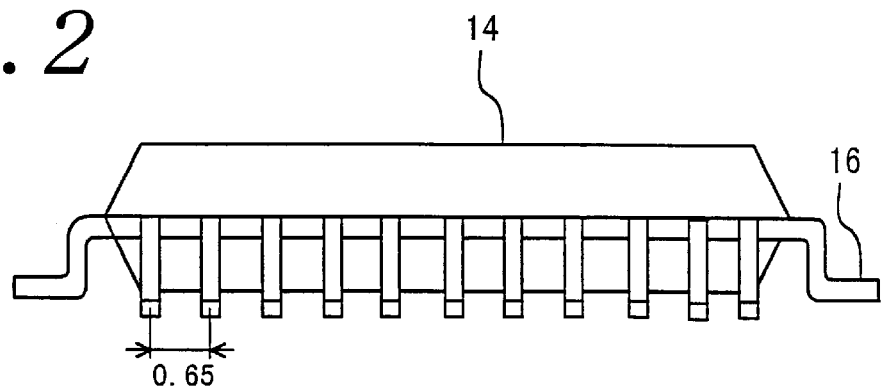
FIG. 2 is a side view illustrating a conventional semiconductor apparatus.
Figure 3:
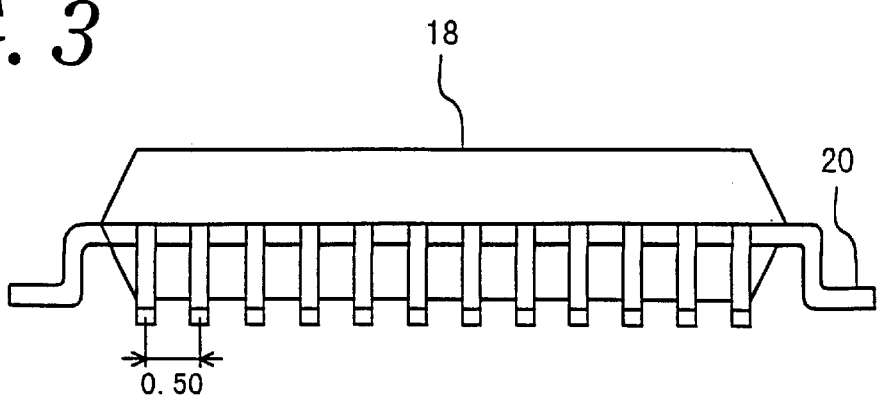
FIG. 3 is a side view illustrating a conventional semiconductor apparatus.

For better understanding of the invention, background technology is first described in conjunction with FIGS. 1 to 6. FIG. 1 shows a typical conventional package, that is QFP (Quad Flat Package), QFJ (Quad Flat J-Lead), SOJ (Small Outline J-Lead) or the like. In FIG. 1, leads (connection terminals) 12 are arranged with a pitch of 0.8 mm and extend from a resin-molded package 10 outwardly. A semiconductor chip, not shown, is contained in the resin-molded packaged 10. In such a QFP type of package design, in order to increase the number of leads, a lead pitch (spacing) has been narrowed in the order of 1.0 mm, 0.8 mm, 0.65 mm, 0.5 mm, 0.4 mm to 0.3 mm, as shown in FIGS. 2 and 3. In FIG. 2, leads (connection terminals) 16 are arranged with a pitch of 0.65 mm and extend from a resin-molded package 14 outwardly. In FIG. 3, leads (connection terminals) 20 are arranged with a pitch of 0.50 mm and extend from a resin-molded package 18 outwardly.

Figure 4:
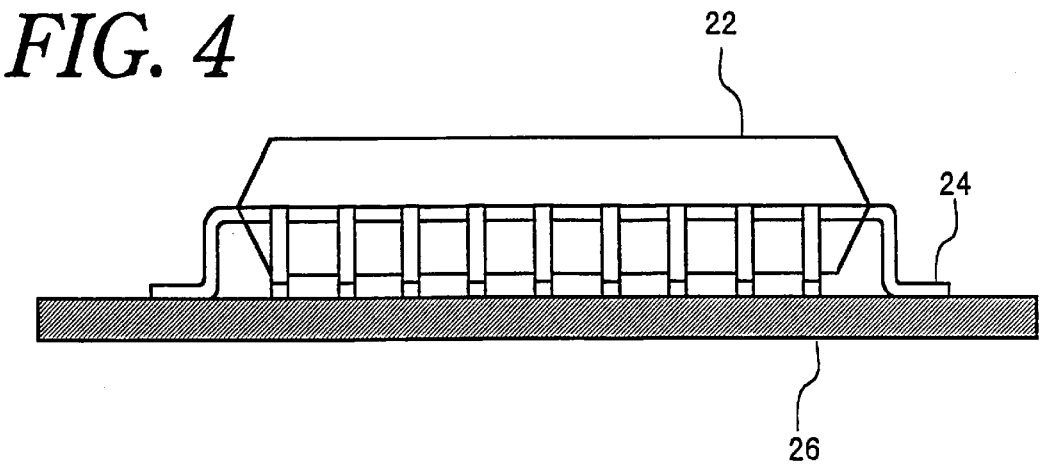
FIG. 4 is a side view illustrating a conventional semiconductor apparatus mounted directly onto a printed circuit board.

FIG. 4 shows a conventional semiconductor apparatus 22 mounted onto a surface of a printed circuit board 26 using a surface mounting technique. Each end of leads 24 are electrically connected onto the printed circuit board 26.

Figure 5:
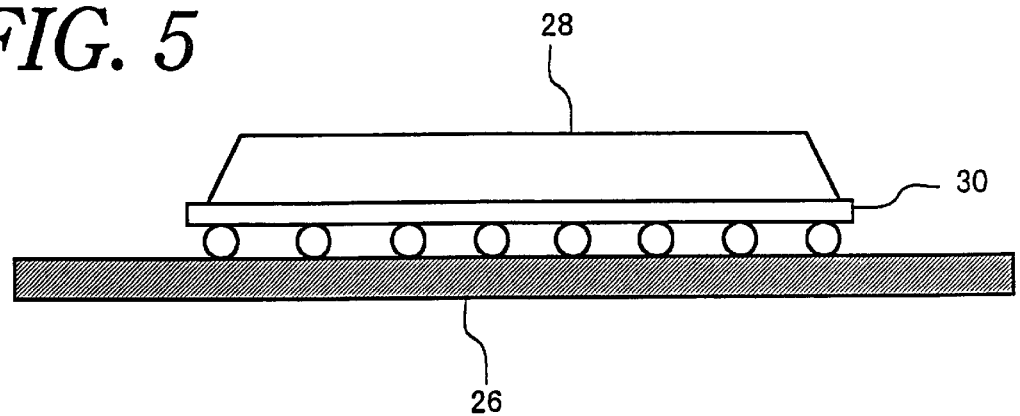
FIG. 5 is a side view illustrating a conventional semiconductor apparatus mounted directly onto a printed circuit board.

FIG. 5 shows a conventional semiconductor apparatus 28 mounted onto a surface of a printed circuit board 26 using a surface mounting technique. The semiconductor apparatus (package) 28 is of BGA (Ball Grid Array) type.

Figure 6:
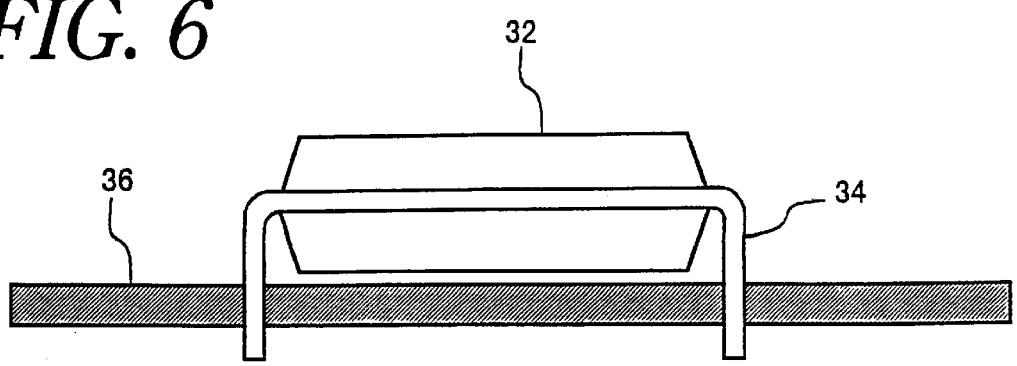
FIG. 6 is a side view illustrating a conventional semiconductor apparatus mounted to a printed circuit board with insert-mounting technique.

FIG. 6 shows a conventional semiconductor apparatus 32 mounted onto a surface of a printed circuit board 36 using an insert mounting technique. Leads 34, extending from the package 32 are inserted into through-holes of the printed circuit board 36.

According to the above mentioned conventional semiconductor apparatuses, the leads (connection terminals) are connected onto the single plane of a circuit board, so that it is required to narrow the pitch between two adjacent leads in order to increase the number of leads. Accordingly, the only way the number of leads can be increased, is to make a pitch of the leads narrower than 0.3 mm. According to the current mounting technology, however, it is difficult to mount the semiconductor apparatus, having leads with a pitch of less than 0.3 mm, onto a circuit board.

Figure 7:
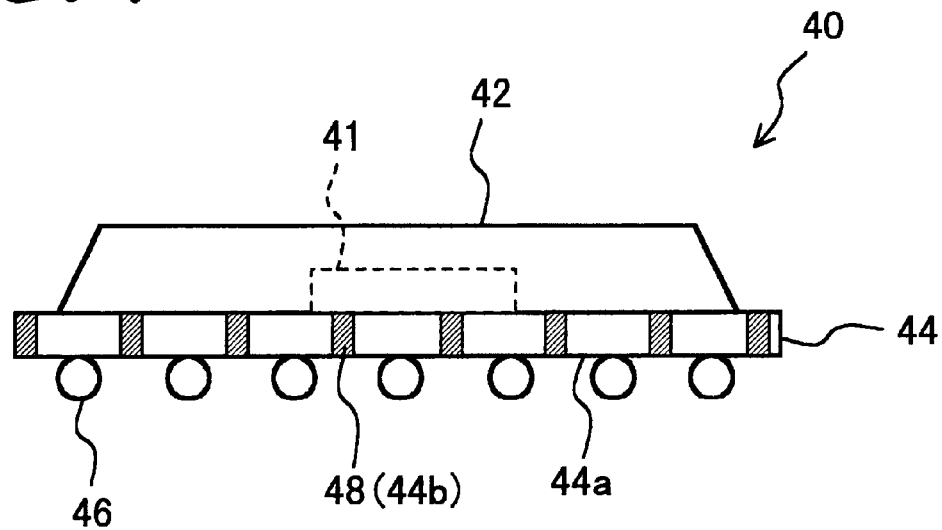
FIG. 7 is a side view illustrating a semiconductor apparatus according to a first preferred embodiment of the invention.
Figure 8:
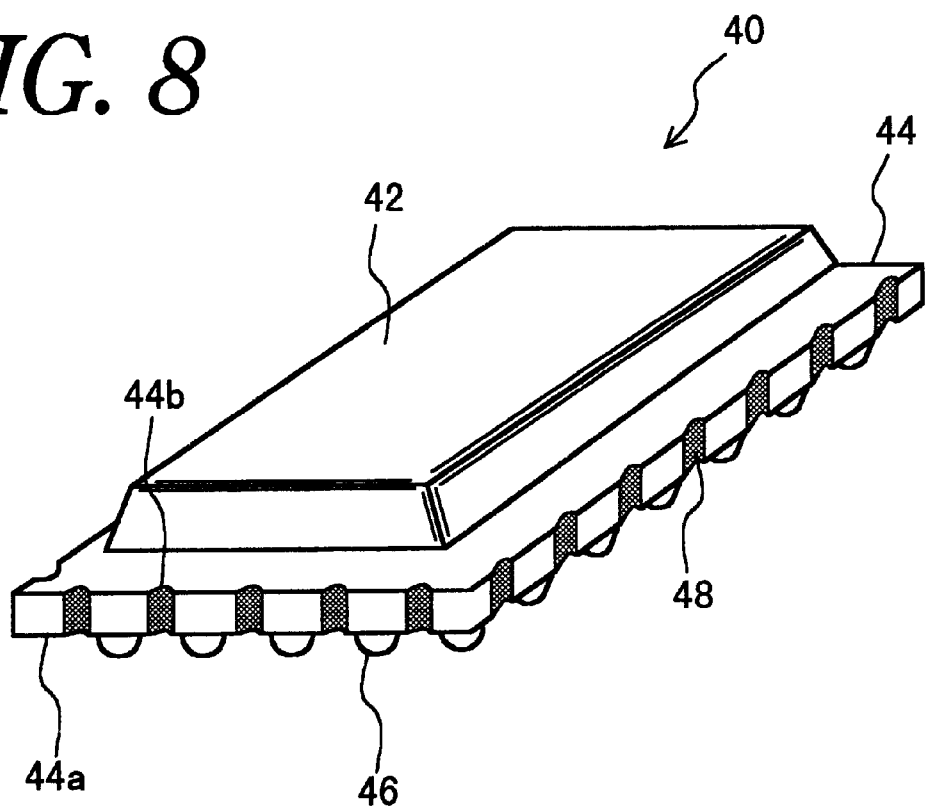
FIG. 8 is a perspective view illustrating the semiconductor apparatus, shown in FIG. 7.

FIGS. 7 and 8 show a semiconductor apparatus 40, according to a first preferred embodiment of the invention. The semiconductor apparatus 40 includes a semiconductor chip 41, and a resin package 42 protecting the semiconductor chip 41. The package includes a resin substrate 44 is disposed under the chip 41. The resin substrate 44 is shaped to have a bottom surface (first connection plane) 44a and a side surface with depressed portions (second connection plane) 44b. A first set of connection terminals 46 are attached on the bottom surface 44a of the resin substrate 44. A second set of connection terminals 48 are attached on the depressed portions 44b (second connection plane) of the resin substrate 44. The first and second sets of connection terminals 46 and 48 are arranged alternately to each other. The first set of connection terminals 46 are arranged with a predetermined pitch to have an enough spacing between two adjacent terminals.

The first and second sets of connection terminals 46 and 48 are arranged on the different planes 44a and 44b, so that the first and second sets of connection terminals 46 and 48 are completely insulated from each other. As a result, the different signals are transmitted through the first and second sets of connection terminals 46 and 48. The semiconductor apparatus 40 can be fabricated by conventional techniques.

Figure 9:
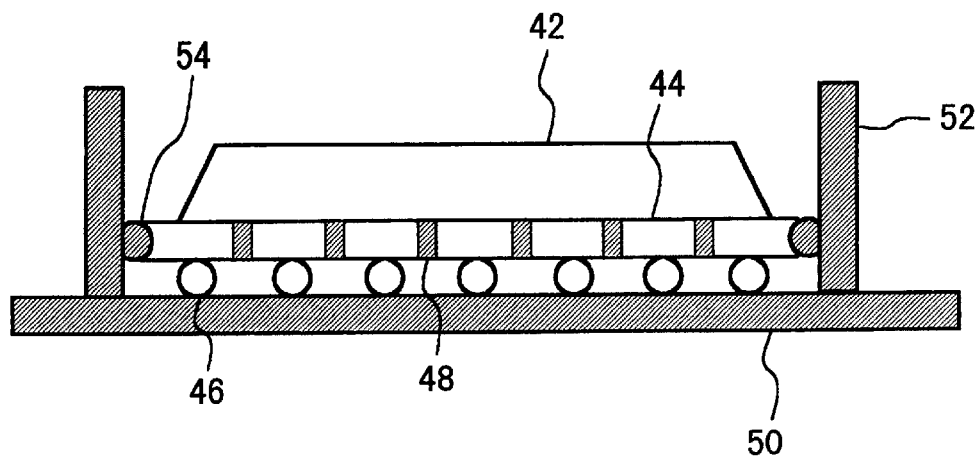
FIG. 9 is a side view illustrating the semiconductor apparatus, shown in FIGS. 7 and 8, mounted directly onto a printed circuit board.

FIG. 9 shows the semiconductor apparatus 40 mounted directly onto first and second printed-circuit boards 50 and 52. Having two different planes of circuit boards is one feature of the invention. The first printed-circuit board 50 is designed to have a horizontal upper surface. The second printed-circuit board 52 is arranged perpendicularly to the first printed-circuit board 50. The first and second printed-circuit board 50 and 52 are provided with wiring patterns (not shown) at locations corresponding to the first and second connection terminals 46 and 48.

In fabrication (mounting process), the semiconductor apparatus 40 is first placed on the first printed-circuit board 50, then the first set of connection terminals 46 are electrically connected with adhesive material onto the wiring pattern of the first printed-circuit board 50. Next, the second set of connection terminals 48 are electrically connected with the adhesive material 54 onto the wiring pattern of the second printed-circuit board 52.

The second set of connection terminals 48 are provided on the depressed plane 44b (second connection plane) of the resin substrate 44, and are electrically connected to the wiring pattern of the second printed-circuit board 52. In this process, the adhesive material 54 is partially inserted into the second set of connection terminals 48 that are shaped to be concave.

Figure 10:
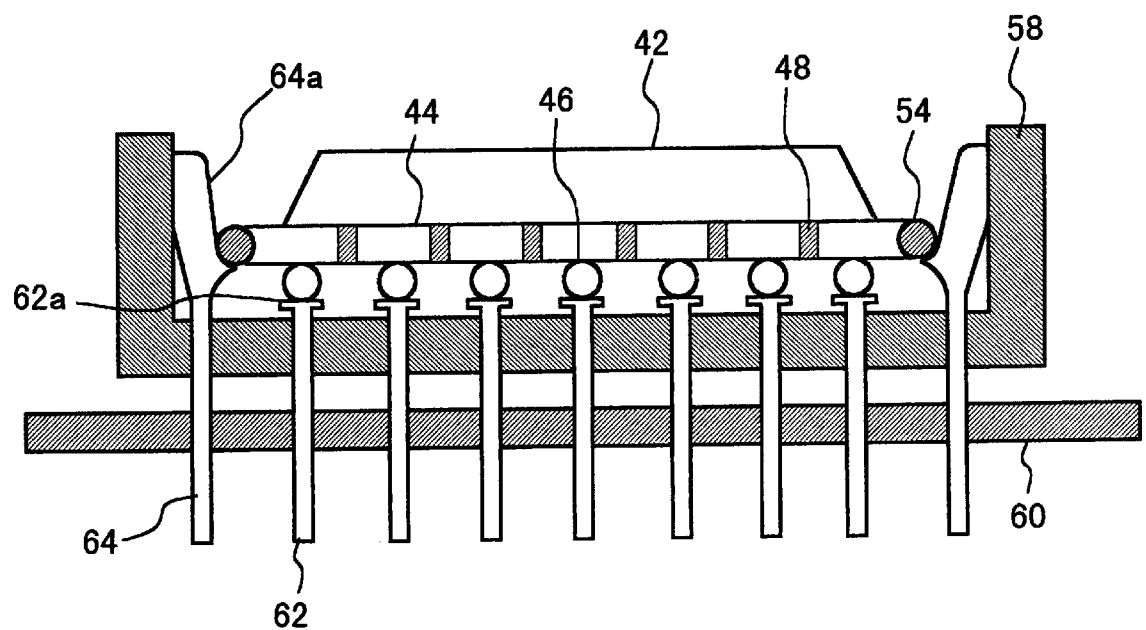
FIG. 10 is a side view illustrating the semiconductor apparatus, shown in FIGS. 7 and 8, mounted to a printed circuit board.

FIG. 10 shows the semiconductor apparatus 40 mounted onto a printed-circuit board 60 using a socket 58. In the socket 58, contact pins 62 and 64 are connected to the first and second sets of connection terminals 46 and 48, respectively. The contact pins 62 and 64 extend out of the socket 58 to function as external pins. The contact pins 62 are arranged to face the first set of connection terminals 46 of the semiconductor apparatus 40, and the contact pins 64 are arranged to face the second set of connection terminals 48. The contact pins 62 are shaped to have flat tops 62a to be in contact with the first set of connection terminals 46, and the contact pins 64 are shaped to have guide portions 64a to be in contact with the second set of connection terminals 48.

In fabrication (mounting process), the socket 58 is connected through the contact pins 62 and 64 to the printed-circuit board 60 in advance. Next, the semiconductor apparatus 40 is mounted into the socket 58, then the first set of connection terminals 46 are electrically connected to the contact pins 62 with adhesive material, and the second set of connection terminals 48 are electrically connected to the contact pins 64 with adhesive material 54. The adhesive material 54 may be placed in advance onto the first and second sets of connection terminals 46 and 48, then the semiconductor apparatus 40 with the adhesive material 54 may be placed into the socket 58.

As described above, according to the semiconductor apparatus 40 of the first preferred embodiment, the first set of connection terminals 46 are arranged at the bottom surface (projected plane) 44a of the resin substrate 44, and the second set of connection terminals 48 are arranged on the second plane 44b, so that the semiconductor apparatus 40 can be provided with many terminals arranged with a narrow pitch.

According to the conventional method, in which the terminals are connected onto a single plane of a circuit board, it is difficult to mount the semiconductor apparatus having connection terminals with less than a 0.3 mm pitch, onto the circuit board. In contrast, according to the first embodiment, the first and second sets of connection terminals 46 and 48 are connected to the different planes 50 and 52 (62a and 64a), so that the connection terminals 46 and 48 can be completely insulated from each other. Therefore, the pitch of the connection terminals in the package 42 can be narrowed and more terminals can be used for the semiconductor apparatus.

According to the first preferred embodiment, the first and second sets of connection terminals 46 and 48 are connected to the different planes 44a and 44b, so that the number of connection terminals 46 and 48 can be easily increased without narrowing the pitch of the terminals on the circuit board 50 (60). In other words, even if the connection terminals 46 and 48 are tightly arranged in the package 42, the connection terminals 46 and 48 can be arranged with enough spacing outside the package 42.

Figure 11:
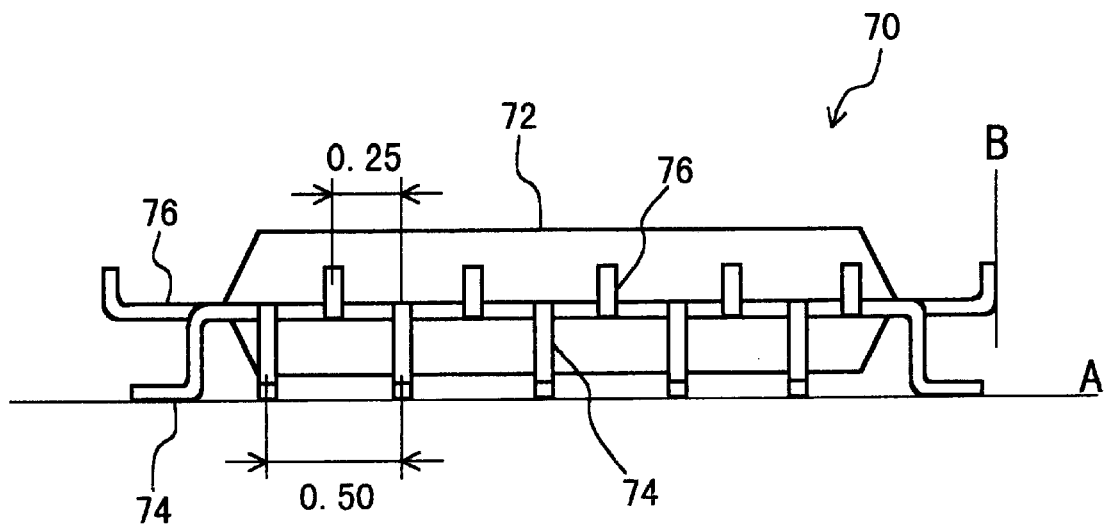
FIG. 11 is a side view illustrating a semiconductor apparatus according to a second preferred embodiment of the invention.
Figure 12:
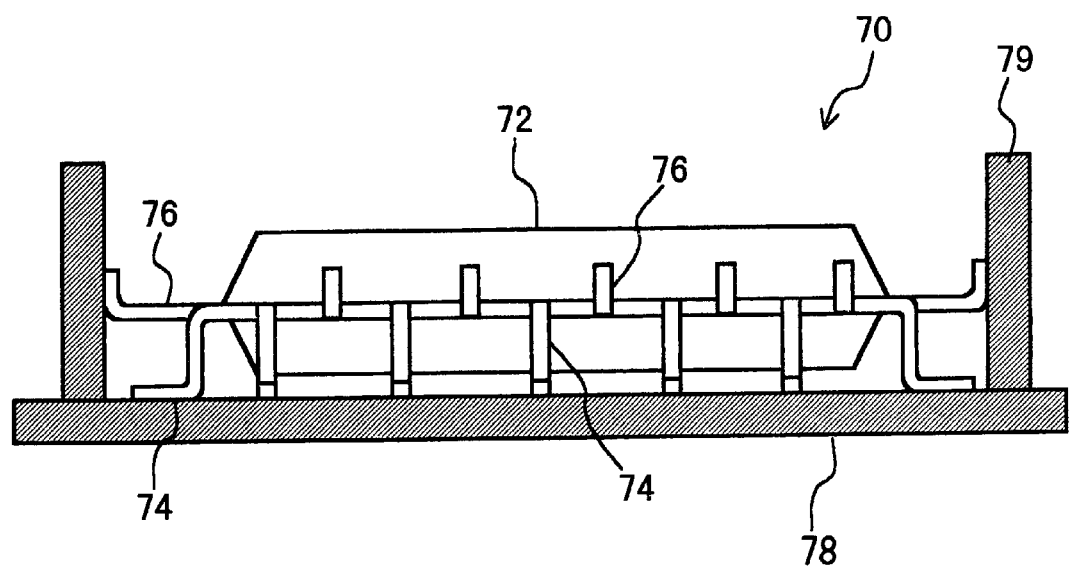
FIG. 12 is a side view illustrating the semiconductor apparatus, shown in FIG. 11, mounted directly onto a printed circuit board.

FIG. 11 shows a semiconductor apparatus 70 according to a second preferred embodiment of the invention. FIG. 12 shows the semiconductor apparatus 70 mounted onto first and second printed-circuit board 78 and 79. The semiconductor apparatus 70 includes a resin package 72 containing a semiconductor chip, not shown, a first set of connection terminals (leads) 74, and a second set of connection terminals (leads) 76. The first and second sets of connection terminals 74 and 76 extend from the package 72 toward a first plane A and a second plane B, respectively. The first and second sets of connection terminals 74 and 76 are arranged alternately to each other.

The second plane B is arranged to be perpendicular to the first plane A. One end of the first set of connection terminals 74 is connected to the semiconductor chip in the resin packaged 72, and the other ends are perpendicularly bent to increase the area being in contact with the first plane A. One end of the second set of connection terminals 76 is connected to the semiconductor chip in the resin packaged 72, and the other end is perpendicularly bent to increase the area being in contact with the second plane B.

According to the above described semiconductor apparatus 70, if the pitch of each set of terminals is designed to be 0.5 mm, the two adjacent terminals would have a spacing (pitch) of 0.25 mm in the resin package 72.

Referring now to FIG. 12, the semiconductor apparatus 70 is mounted to first and second printed-circuit boards 78 and 79. The first and second printed-circuit boards 78 and 79 are provided with wiring patterns (not shown) at locations corresponding to the connection terminals 74 and 76.

In fabrication (mounting process), the semiconductor apparatus 70 is placed on the first printed-circuit board 78, then the first set of connection terminals 74 are electrically connected with adhesive material onto the wiring pattern of the first printed-circuit board 78. Next, the second set of connection terminals 76 are electrically connected with the adhesive material onto the wiring pattern of the second printed-circuit board 79. The first and second printed-circuit boards 78 and 79 correspond to the first and second planes A and B, in FIG. 11.

According to the above described second preferred embodiment, even if the pitch of each set of connection terminals 74 and 76 is designed to be 0.25 mm in the resin packaged 72, the two adjacent terminals to be connected onto the printed-circuit boards 78 and 79 would have a spacing (pitch) of 0.5 mm, and therefore, the semiconductor apparatus 70 is easily mounted.

Figure 13:
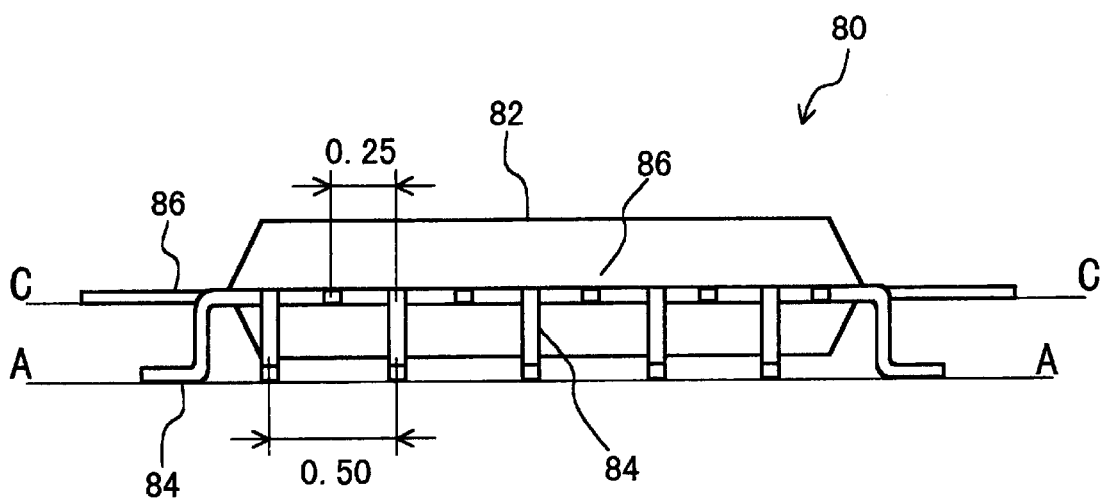
FIG. 13 is a side view illustrating a semiconductor apparatus according to a second preferred embodiment of the invention.
Figure 14:
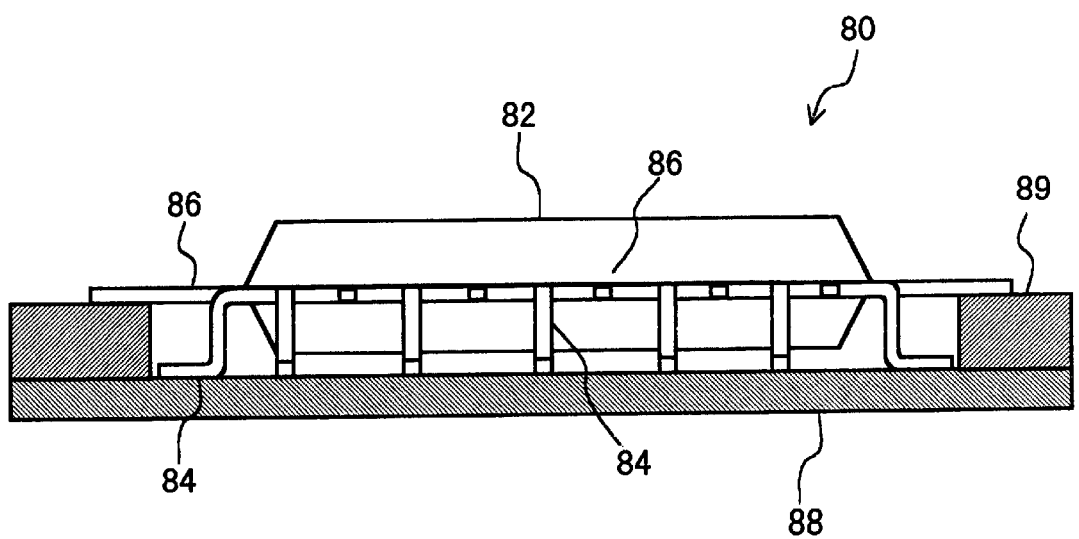
FIG. 14 is a side view illustrating the semiconductor apparatus, shown in FIG. 13, mounted directly onto a printed circuit board.

FIG. 13 shows a semiconductor apparatus 80 according to a third preferred embodiment of the invention. FIG. 14 shows the semiconductor apparatus 80 mounted directly onto first and second printed-circuit boards 88 and 89. The semiconductor apparatus 80 includes a resin package 82 containing a semiconductor chip (not shown); a first set of connection terminals (leads) 84 extending from the resin package 82 toward a lower plane A (first plane); and a second set of connection terminals 86 extending from the resin package 82 parallel to a plane C (second plane). The first and second sets of connection terminals 84 and 86 are arranged alternately to each other.

The first set of connection terminals 84 are shaped to have perpendicularly-bent ends to increase the area to be in contact with the plane A. The plane C is arranged perpendicular to the plane A. The second set of connection terminals 86 are in contact with the plane C without spacing between them. In the third preferred embodiment, if the pitch of each connection terminal 84 and 86 is designed to be 0.5 mm, the two adjacent terminals would have a spacing (pitch) of 0.25 mm in the resin package 82.

Referring now to FIG. 14, the first and second printed-circuit boards 88 and 89 correspond to the first and second planes A and C, respectively. The first and second planes A and C are arranged parallel to each other. The first and second printed-circuit boards 88 and 89 are provided with wiring patterns (not shown) at locations corresponding to the connection terminals 84 and 86.

In fabrication (mounting process), the semiconductor apparatus 80 is first placed on the first printed-circuit board 88, then the first set of connection terminals 84 are electrically connected with adhesive material onto the wiring pattern of the printed-circuit board 88. Next, the second set of connection terminals 86 are electrically connected with the adhesive material onto the wiring pattern of the second printed-circuit board 89.

As described above, the semiconductor apparatus 80, according to the third embodiment, even if the pitch of the first and second set of connection terminals 84 and 86 is designed to be 0.25 mm in the resin package 82, the two adjacent terminals to be connected onto the printed-circuit boards 88 and 89 would have a spacing (pitch) of 0.5 mm. Therefore, the semiconductor apparatus 80 is easily mounted onto the circuit boards 88 and 89. In addition, the first and second printed-circuit boards 88 and 89 are arranged parallel to each other, so that the total thickness can be reduced.

According to the invention, the first and second sets of connection terminals are connected to the different planes, so that the number of connection terminals can be easily increased without narrowing the pitch of the terminals on the circuit board. In other words, even if the connection terminals are tightly arranged in the package, the connection terminals can be arranged with enough spacing outside the package.

The invention is applicable to any type of semiconductor apparatuses and any type of packages. It is clear that the pitch of the connection terminals is not limited by the above described embodiments. Fabrication process, the type of the chip substrate, the number of terminals, the arrangement of the package, and so on are not limited by the above described embodiments.

It will be understood that the above description of the present invention is susceptible to various modifications, changes and adaptations, and the same are intended to be comprehended with the meaning and range of equivalents of the appended claims.

What is claimed is:

1. A semiconductor apparatus, comprising:
   a semiconductor chip contained in a package;
   a first set of connection terminals, each of the connection terminals of the first set having one end connected to the semiconductor chip, and another end connected onto a first connection plane outside of the package; and
   a second set of connection terminals, each of the connection terminals of the second set having one end connected to the semiconductor chip, and another end connected onto a second connection plane outside of the package, wherein
   the first and second connection planes are electrically connected to a circuit board; and
   the first and second sets of connection terminals are arranged alternately with a predetermined pitch in the package.

2. The semiconductor apparatus, according to claim 1, wherein:
   the first set of connection terminals are arranged on a first surface of the package, while the second set of connection terminals are arranged on a second surface of the package.

3. The semiconductor apparatus, according to claim 2, wherein
   the first and second surfaces are perpendicular to each other.

4. The semiconductor apparatus, according to claim 3:
   wherein the package includes an insulation substrate, wherein
   the first set of connection terminals are arranged at a bottom surface of the insulation substrate, while the second set of connection terminals are arranged at a side surface of the insulation substrate.

5. The semiconductor apparatus, according to claim 4, wherein
   the semiconductor apparatus is of BGA (Ball Grid Array) type.

6. The semiconductor apparatus, according to claim 5, wherein
   the first set of connection terminals are connected to first contact pins,
   the second set of connection terminals are connected to second contact pins, and
   the first and second contact pins extend in the same direction to be connected to the circuit board.

7. The semiconductor apparatus, according to claim 6, wherein
   the semiconductor apparatus is covered with a protection socket.

8. The semiconductor apparatus, according to claim 1, wherein
   the first and second sets of connection terminals are arranged on a common surface, and extend in different directions from each other.

9. The semiconductor apparatus, according to claim 8, wherein
   the first and second connection planes are arranged perpendicularly to each other, and
   the first set of connection terminals extend to the first connection plane, while the second set of connection terminals extend to the second connection plane.

10. The semiconductor apparatus, according to claim 8, wherein
    the first and second connection planes are arranged parallel to each other at different levels, and
    the first set of connection terminals extend to the first connection plane, and the second set of connection terminals extend parallel to the second connection plane.

11. A combination of a semiconductor apparatus and a circuit board, wherein,
    the semiconductor apparatus comprises:
    (1) a semiconductor chip contained in a package;
    (2) a first set of connection terminals, each of the connection terminals of the first set having one end connected to the semiconductor chip; and
    (3) a second set of connection terminals, each of the connection terminals of the second set having one end connected to the semiconductor chip, wherein the first and second sets of connection terminals are arranged alternately with a predetermined pitch, and
    the circuit board comprises:
    (1) a first connection plane onto which other ends of the first set of connection terminals are connected; and
    (2) a second connection plane onto which other ends of the second set of connection terminals are connected.

12. The combination, according to claim 11, wherein
    the first and second sets of connection terminals of the semiconductor apparatus are respectively arranged on first and second surfaces of the package, which are perpendicular to each other.

13. The combination, according to claim 12, wherein
    the package of the semiconductor apparatus further comprises an insulation substrate, of which a bottom surface and a side surface are arranged respectively parallel to the first and second connection planes of the circuit board, and
    the first and second sets of connection terminals are positioned on the bottom surface and side surface of the insulation substrate, respectively.

14. The combination, according to claim 11, wherein
    the first and second sets of connection terminals of the semiconductor apparatus are arranged on a common surface of the package, and extend in different directions.

15. The combination, according to claim 14, wherein
    the first and second connection planes of the circuit board are arranged perpendicularly to each other, and
    the first set of connection terminals extend to the first connection plane, while the second set of connection terminals extend to the second connection plane.

16. The combination, according to claim 14, wherein
    the first and second connection planes of the circuit board are arranged parallel to each other a different levels, and
    the first set of connection terminals extend to the first connection plane, and the second set of connection terminals extend parallel to the second connection plane.

17. A semiconductor apparatus, comprising:

a semiconductor chip contained in a package;

a first set of connection terminals, each of the connection terminals of the first set having one end connected to the semiconductor chip, and another end connected onto a first connection plane outside of the package; and a second set of connection terminals, each of the connection terminals of the second set having one end connected to the semiconductor chip, and another end connected onto a second connection plane outside of the package, wherein the first and second sets of connection terminals are arranged alternately with a predetermined pitch in the package;

and wherein the first set of connection terminals are connected to first contact pins, the second set of connection terminals are connected to second contact pins, and the first and second contact pins extend in the same direction to be connected to the circuit board.

* * * * *